Feb. 5, 1952 E. F. DE MERS 2,584,850

FREQUENCY AND VOLTAGE STABILIZED OSCILLATOR

Filed Dec. 26, 1947

INVENTOR.
Edward F. DeMers

BY T. L. Bowes

Atty.

Patented Feb. 5, 1952

2,584,850

UNITED STATES PATENT OFFICE 2,584,850

FREQUENCY- AND VOLTAGE-STABILIZED OSCILLATOR

Edward F. De Mers, Urbana, Ill., assignor to Stromberg-Carlson Company, a corporation of New York Application December 26, 1947, Serial No. 793,821

7 Claims. (Cl. 250—36)

The present invention relates to oscillator circuits and more particularly to an improved control arrangement for an ultra high frequency oscillator which is tunable over a wide frequency range to provide acceptable output voltage amplitude stability at all output frequencies within the tuning range.

In certain applications, such, for example, as at the converter stages of frequency modulation receivers, television receivers and the like, it is necessary to use ultra high frequency oscillators which are tunable over relatively wide frequency ranges. One of the problems involved in producing a satisfactory oscillator for such uses is that of obviating wide variations in the amplitude of the oscillator output voltage as the oscillator is tuned from one end of its tuning range to the other. Suggested solutions for this problem have not proven entirely satisfactory, primarily due to the complexity and cost of the added equipment required to maintain the amplitude of the oscillator output voltage within acceptable limits.

It is an object of the present invention, therefore, to provide an improved arrangement for reducing to a tolerable level amplitude variations in the output signal voltage of an oscillator circuit.

It is another object of the present invention to provide in an oscillator circuit, an oscillation amplitude regulating network which minimizes variations in the amplitude of the oscillations and is made up of only a few low-cost circuit components of standard commercial construction.

Figure 2:
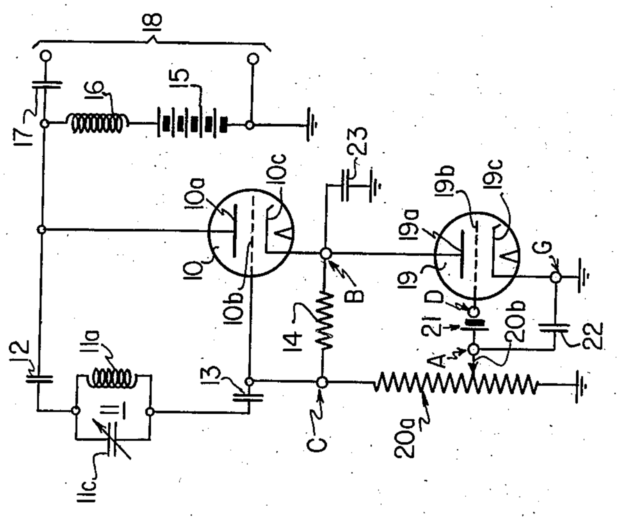
Figure 1:
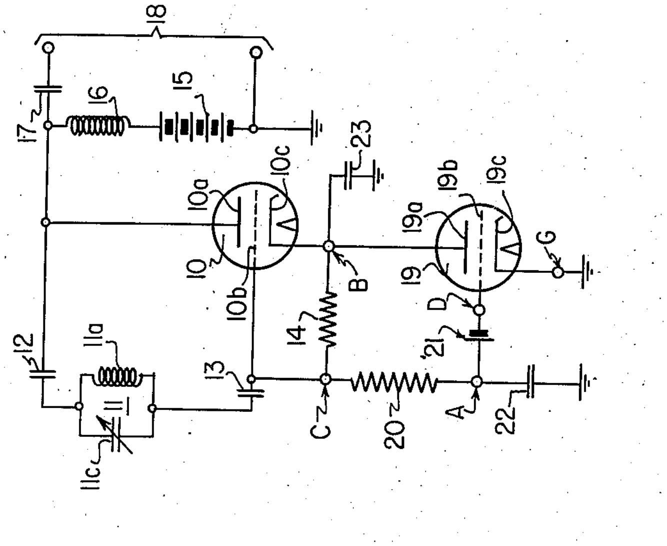

The invention, both as to its organization and method of operation, together with further objects and advantages thereof, will best be understood by reference to the following specification taken in connection with the accompanying drawings, in which:

Fig. 1 is a diagrammatic illustration of one embodiment of the present improved oscillator circuit; and Fig. 2 diagrammatically illustrates a modified embodiment of the present improved oscillator circuit.

Referring now to the drawing and more particularly to Fig. 1 thereof, the present invention is there illustrated in its embodiment in an oscillator circuit of the modified Colpitts type which is sometimes referred to as an ultraudion circuit. In brief, the circuit comprises an oscillator tube 10 of the well known triode type having an anode 10a and a cathode 10c separated to define a space current path in which is disposed the usual control grid 10b. The anode 10a and control grid 10b are coupled through a pair of coupling condensers

12 and 13 to the terminals of a tunable frequency determining circuit 11. In accordance with conventional practice, the circuit 11 is of the parallel resonant type, consisting of an inductance element 11a shunted by a variable condenser 11c, the capacitance of which may be varied within limits to vary the output frequency of the circuit over the frequency range for which the oscillator circuit is designed. The required bias potential between the control grid 10b and the cathode 10c is obtained by connecting a grid resistor 14 between the identified electrodes of the tube 10. Anode potential is supplied to the anode 10a of the tube 10 from a space current supply source 15 through a high frequency choke coil 16. The high frequency output voltage of the circuit as developed between the anode 10a of the tube 10 and ground, is impressed across the output terminals 18 of the circuit through a coupling condenser 17. As thus far described, the circuit is entirely conventional.

As explained above, when the circuit is designed to operate at high frequencies and the specifications for its use require that the output frequency of the circuit be variable over a wide frequency band, wide variations in the amplitude of the oscillations developed in the circuit and hence of the output voltage appearing across the output terminals 18 of the circuit may be expected as the circuit is tuned from one end of the band to the other, in the absence of facilities for minimizing such variations. In accordance with the present invention, this problem is obviated by providing means including a variable impedance element in the form of a regulator tube 19 for varying the voltage impressed across the space current path of the tube 10 from the source 15 inversely with or in the opposite sense from variations in the amplitude of the oscillations developed in the circuit. More specifically, the space current path defined between the anode 19a and cathode 19c of the regulator tube 19 is connected in series with the current source 15 and the choke coil 16 across the space current path of the tube 10, such that a variable portion of the available voltage of the source 15 is dissipated as a voltage drop across the space current path of the tube 19. The extent of such voltage dissipation is, of course, a function of the conductivity of the tube 19 and hence of the magnitude of the bias potential impressed upon the control grid 19b of the regulator tube. Also, in accordance with the present invention, the bias voltage developed across the grid resistor 14 is utilized to control the conductivity of the tube 19, or more particularly the impedance of the space current path through this tube, in the correct sense to reduce variation in the amplitude of the oscillations developed in the oscillator circuit. To this end, the bias voltage developed across the grid resistor 14 is negatively applied to the control grid 19b of the regulator tube 19 through a radio frequency isolating resistor 20 which is connected directly between the control grids of the tubes 10 and 19. If required, a small biasing battery 21 may be included in this connection at a point directly adjacent the control grid 19b for the purpose of establishing the desired normal bias potential upon this grid. Suitable by-pass condensers 22 and 23 are employed for the respective purposes of preventing the high frequency oscillations in the circuit from being applied to the control grid of the tube 19 and by-passing the high frequency output current around the space current path of the regulator tube 19 in the output circuit of the oscillator.

As explained above, the general mode of operation of the oscillator section of the described circuit is entirely conventional and well understood in the art. Briefly, however, the energy feedback required for sustained excitation of the tunable frequency determining circuit 11 occurs through the interelectrode capacitances of the oscillator tube 10. The extent of the feed-back is determined by the relative values of the anode-to-cathode and grid-to-cathode capacitances of the oscillator tube and may be varied within limits, as desired, by changing the ratio of these two capacitances. Conveniently this may be accomplished by connecting a small variable capacitance, not shown, between the grid 10b and cathode 10c of the tube 10 and setting the same at the particular capacitance value which provides the necessary feed-back to insure stable operation of the circuit.

With the oscillator section of the circuit in operation, the unidirectional grid current flow from the control grid 10b to the cathode 10c of the tube 10 causes a bias voltage to be developed across the grid resistor 14 which has the effect of maintaining the desired potential difference between the two electrodes 10b and 10c. Such grid current flow obviously occurs in a direction which makes the point C of the network negative with respect to the point B. Also with the circuit operating, space current derived from the source 15 traverses a path which includes the radio frequency choke coil 16, the anode-to-cathode space current path of the oscillator tube 10 and the anode-to-cathode space current path of the regulator tube 19. Thus, the available voltage of the source 15 is divided between the space current paths of the two tubes 10 and 19 in a ratio determined by the ratio of the relative impedances of these two paths. Preferably, the tube 19 and grid resistor 14 are so chosen that the portion B—G of the available voltage of the current source 15 which appears across the anode-to-cathode space current path of this tube is always less than the bias voltage B—C developed across the grid resistor 14. The difference between the two voltages B—C and B—G is the bias voltage negatively applied to the control grid 19b of the regulator tube 19, assuming that no biasing battery 21 is provided additively to supplement the bias voltage. In any event, the total normal bias voltage between the cathode and control grid of the tube 19, as represented by the voltage B—C plus the voltage of the battery 21, if used, less the voltage B—G, should be such that when the signal output voltage across the terminals 18 is at the normal amplitude level, the tube 19 is biased approximately to the middle of the useful part of its grid-voltage-anode current characteristic curve. Any departure from this normal value obviously causes a change in the impedance of the space current path through the tube 19 having a magnitude which is determined by the magnitude of the bias voltage change multiplied by the amplification factor of the tube 19.

In considering the manner in which the desired regulating action is obtained, it will be understood that as the amplitude of the oscillations developed in the circuit starts to increase, the voltage B—C appearing across the grid resistor 14 is correspondingly increased to further increase the differential between this voltage and the voltage drop B—G across the space current path of the tube 19. Effectively, this is the same as increasing the negative bias voltage between the control grid 19b and the cathode 19c of the regulator tube. The effect is to increase the impedance of the space current path through the tube 19 relative to the impedance of the space current path through the tube 10, with the result that an increased portion of the available voltage supplied by the source 15 is dissipated across the space current path of the tube 19. Thus the voltage impressed across the space current path of the tube 10 is decreased to reduce the amplitude of the oscillations developed in the circuit. When the magnitude of the oscillations in the circuit start to decrease, the converse action occurs. Specifically, the bias voltage across the grid resistor 14 drops to reduce the bias potential on the control grid 19b and hence decrease the impedance of the space current path through the tube, with the result that a larger portion of the available voltage is impressed across the space current path of the tube 10. Thus, the described voltage regulating means has the effect of reducing the magnitude of variations in the amplitude of the oscillations developed in the circuit, and hence of reducing departures in the voltage appearing across the output terminals 18 from a desired value.

From the above explanation, it will be understood that the regulating action which occurs in the circuit is somewhat similar to the action which occurs in a conventional automatic gain control system in the sense that the regulation effected does not positively prevent amplitude changes in the circuit but only serves to limit the magnitude of such changes. Thus, a change in either sense of the voltage B—C across the grid resistor 14 is required in order to initiate a change in the same sense of the impedance of the space current path through the tube 19. The instantaneous response of the tube 19 serves immediately to produce a change of the opposite sense in the amplitude of the oscillations developed in the circuit, which in turn results in a decrease in the rate of change of the voltage across the grid resistor 14 and hence in the rate of change of the bias potential on the control grid 19b of the regulator tube. Concurrently, the voltage B—G across the space current path of the tube 19 changes in the correct sense to oppose the change in bias potential on the grid 19b of the tube 19. These inter-related responses soon result in the establishment of a condition of stability, which prevails until such time as a further change occurs in the amplitude of the oscillations in the circuit, due, for example, to a change in the setting of the tuning condenser 11c or, alternatively, to temperature induced variations in the circuit constants of the oscillator network.

Referring now more particularly to Fig. 2 of the drawing, the modified embodiment of the invention there illustrated is substantially similar to that shown in Fig. 1 and described above. Accordingly, the same reference characters have been used in the two figures to identify corresponding parts. From a comparison of the two circuits, it will be seen that in the Fig. 2 circuit, a potentiometer resistor 20*a* is used to connect the control grid 10*b* of the oscillator tube 10 directly to the cathode 19*c* of the regulator tube 19, and that a tap 20*b*, adjustable along the resistor 20*a*, is employed to impress a variable portion of the voltage developed across the grid resistor 14 upon the control grid 19*b* of the regulator tube 19. It will also be noted that the grid resistor 14 and the potentiometer resistor 20*a* are effectively connected in series across the space current path of the tube 19. It is to be expected, therefore, that a portion of the space current traversing the tube 10 will traverse the two series connected resistors 14 and 20*a* as well as the tube 19. The extent of such current flow through the resistors 14 and 20*a* is reduced to a negligible value by employing a potentiometer resistor 20*a* having a resistance value which is substantially infinitely large with respect to the resistance of the space current path through the tube 19. This means that only the difference between the voltage B—C and the voltage B—G appears across the potentiometer resistor 20*a*. The polarity of this difference voltage is obviously such that the terminal C of the resistor 20*a* is negative with respect to the grounded terminal of this resistor and hence with respect to the cathode 19*c* of the regulator tube 19. It will thus be understood that by moving the adjustable tap 20*b* along the resistor 20*a*, any desired portion of the available difference voltage appearing across the potentiometer resistor 20*a* may be negatively applied to the control grid 19*b*. Since the magnitude of this difference voltage obviously varies in accordance with variations in the voltage B—C across the resistor 14, corresponding variations are produced in the bias voltage applied to the grid 19*b*. Thus, the mode of operation of the regulating means provided in the Fig. 2 embodiment of the invention is substantially the same as in the Fig. 1 arrangement and will be readily understood from the above explanation.

From the preceding description, it will be apparent that the present invention affords a very simple and thoroughly reliable solution to the problem of minimizing variations in the amplitude of the signal voltage developed by an oscillator circuit and particularly by ultra high frequency signal generators which in certain cases must of necessity be tunable over wide frequency bands. Thus, the regulating action produced is completely independent of the particular frequency at which the circuit may be operated. Further, only a small number of low cost components of standard commercial construction are required in order to obtain the desired regulatory action. Thus, in the Fig. 1 embodiment of the invention, the only added elements are the tube 19, the resistor 20, the by-pass condensers 22 and 23, and if required, a C-battery 21, which components may, of course, be readily purchased through commercial channels.

It will also be understood that the arrangement of the present invention is adapted substantially to compensate for voltage fluctuations of space current supply source 15. The variations in output amplitude which normally would result from such fluctuations are effectively overcome, in the same manner as described above in connection with variations due to changes in frequency.

While the two embodiments of the invention have been described, it will be understood that various modifications may be made therein which are within the true spirit and scope of the invention as defined in the appended claims.

What is desired to be secured by Letters Patent of the United States is:

1. An oscillator circuit, comprising an oscillator tube provided with electrodes defining a space current path, means for deriving a unidirectional bias voltage from said circuit which varies in the same sense with variations in the amplitude of the oscillations in said circuit, and means controlled by said bias voltage for impressing an operating voltage across said space current path which varies in the opposite sense from variations in said bias voltage, thereby to minimize variations in the amplitude of said oscillations.

2. An oscillator circuit, comprising an oscillator tube provided with an anode, a cathode and a control grid, a grid resistor connected between said cathode and control grid to have a unidirectional bias voltage developed thereacross which varies in magnitude in the same sense as variations in the amplitude of the oscillations developed in said circuit, a current source for impressing a voltage across said anode and cathode, and regulator means responsive to variations in the magnitude of said bias voltage for varying the voltage impressed between said anode and cathode in the same sense as the variations in the magnitude of said bias voltage, thereby to reduce variations in the amplitude of said oscillations.

3. An oscillator circuit, comprising an oscillator tube provided with an anode, a cathode and a control grid, a grid resistor connected between said cathode and control grid to have a unidirectional bias voltage developed thereacross which varies in magnitude in the same sense as variations in the amplitude of the oscillations developed in said circuit, a current source, and a bias-controlled variable impedance element connected in series with said source across said anode and cathode and operative in response to variations in said bias voltage to vary the impedance of said variable impedance element in the same sense as the variations in said bias voltage, thereby to reduce variations in the amplitude of said oscillations.

4. An oscillator circuit, comprising an oscillator tube provided with an anode, a cathode and a control grid, a grid resistor connected between said cathode and control grid to have a unidirectional bias voltage developed thereacross which varies in magnitude in accordance with variations in the amplitude of oscillations developed in said circuit, a current source, a regulator tube including electrodes defining a space current path connected in series with said source across said anode and cathode and also including a control grid for varying the impedance of said space current path, and means for impressing said bias voltage on said control grid to vary the impedance of said space current path in the same sense with variations in the amplitude of oscillations in said circuit, thereby to reduce variations in the amplitude of said oscillations.

5. An oscillator circuit, comprising an oscillator tube provided with an anode, a cathode and a control grid, a grid resistor connected between said cathode and control grid to have a unidirectional bias voltage developed thereacross which varies in magnitude in accordance with variations in the amplitude of oscillations developed in said circuit, a current source, a regulator tube including an anode and cathode defining a space current path connected in series with said source across the anode and cathode of said oscillator tube and also including a control grid for varying the impedance of said space current path, the bias voltage developed across said grid resistor being substantially greater than the voltage drop across said space current path, and means for impressing said bias voltage on the control grid of said regulator tube to vary the impedance of said space current path in the same sense as variations in the amplitude of oscillations in said circuit, thereby to reduce variations in the amplitude of said oscillations.

6. An oscillator circuit, comprising an oscillator tube provided with an anode, a cathode and a control grid, a grid resistor connected between said cathode and control grid to have a unidirectional bias voltage developed thereacross which varies in magnitude in accordance with variations in the amplitude of oscillations developed in said circuit, a current source, a regulator tube including an anode and cathode defining a space current path connected in series with said source across the anode and cathode of said oscillator tube and also including a control grid for varying the impedance of said space current path, the bias voltage developed across said grid resistor being substantially greater than the voltage drop across said space current path, and adjustable means for impressing an adjustable portion of said bias voltage on the control grid of said regulator tube to vary the impedance of said space current path in the same sense as variations in the amplitude of oscillations in said circuit, thereby to reduce variations in the amplitude of said oscillations.

7. An oscillator circuit, comprising an oscillator tube provided with an anode, a cathode and a control grid, a grid resistor connected between said cathode and control grid to have a unidirectional bias voltage developed thereacross which varies in magnitude in accordance with variations in the amplitude of oscillations developed in said circuit, a current source, a regulator tube including an anode and cathode defining a space current path connected in series with said source across said anode and cathode of said oscillator tube and also including a control grid for varying the impedance of said space current path, the bias voltage developed across said grid resistor being substantially greater than the voltage drop across said path, a resistor connected between the grid of said oscillator tube and the cathode of said regulator tube having a resistance value many times greater than the impedance of said space current path, and a connection between the control grid of said regulator tube and a point along said resistor for impressing at least a portion of said bias voltage on the grid of said regulator tube to vary the impedance of said space current path in the same sense as variations in the amplitude of oscillations in said circuit, thereby to reduce variations in the amplitude of said oscillations.

EDWARD F. DE MERS.

REFERENCES CITED

The following references are of record in the file of this patent:

UNITED STATES PATENTS

| Number | Name | Date |
|---|---|---|
| 2,103,619 | Hallmark | Dec. 28, 1937 |
| 2,320,876 | Mabry | June 1, 1943 |
| 2,391,085 | Crandell | Dec. 18, 1945 |
| 2,461,514 | Bowers | Feb. 15, 1949 |

FOREIGN PATENTS

| Number | Country | Date |
|---|---|---|
| 554,468 | Great Britain | July 6, 1943 |